(12) United States Patent
     Li et al.

(10) Patent No.: US 9,667,075 B2
(45) Date of Patent: May 30, 2017

(54) WIRELESS CHARGING DEVICE AND METHOD USING THE SAME

(71) Applicant: BYD Company Limited, Shenzhen (CN)

(72) Inventors: Minglin Li, Shenzhen (CN); Qingchun Yang, Shenzhen (CN); Xinhua Zhang, Shenzhen (CN); He Huang, Shenzhen (CN); Xinwei Cai, Shenzhen (CN); Zaixing Yang, Shenzhen (CN); Ying Zhou, Shenzhen (CN); Yanqin Chen, Shenzhen (CN); Xianjun Kong, Shenzhen (CN); Dajun Chen, Shenzhen (CN)

(73) Assignee: BYD Company Limited, Shenzhen (CN)

( * ) Notice: Subject to any disclaimer, the term of this patent is extended or adjusted under 35 U.S.C. 154(b) by 0 days.

(21) Appl. No.: 14/784,454

(22) PCT Filed: Apr. 15, 2014

(86) PCT No.: PCT/CN2014/075427
§ 371 (c)(1),
(2) Date: Oct. 14, 2015

(87) PCT Pub. No.: WO2014/169814
PCT Pub. Date: Oct. 23, 2014

(65) Prior Publication Data
US 2016/0072321 A1 Mar. 10, 2016

(30) Foreign Application Priority Data

Apr. 15, 2013 (CN) .......................... 2013 1 0128803
Apr. 15, 2013 (CN) ..................... 2013 2 0186562 U

(51) Int. Cl.
*H04B 5/00* (2006.01)
*H02J 7/00* (2006.01)
(Continued)

(52) U.S. Cl.
CPC ........ *H02J 7/0029* (2013.01); *H01L 23/4093* (2013.01); *H02J 7/0042* (2013.01);
(Continued)

(58) Field of Classification Search
CPC ................................ H04B 5/00; H02J 7/0029
See application file for complete search history.

(56) References Cited

U.S. PATENT DOCUMENTS 7,697,963 B1    4/2010  Pomery
9,270,797 B2 *  2/2016  Backman ............... H04R 9/022
(Continued)

FOREIGN PATENT DOCUMENTS

CN    101359164 A    2/2009
CN    102545326 A    7/2012
(Continued)

OTHER PUBLICATIONS

Supplementary European Search Report for Application No. EP 14 78 5258 dated Mar. 9, 2016.
(Continued)

*Primary Examiner* — Cindy Trandai
(74) *Attorney, Agent, or Firm* — Alston & Bird LLP

(57) ABSTRACT

A wireless charging device (100) includes a shell (1), a heat conduction plate (2), a charging assembly (4) and a connecting assembly (5). The heat conduction plate (2) includes a first portion (201), a second portion (202) parallel with the first portion (201) and contacted with an inner surface of the shell (1), and a third portion (203) connecting a lower edge of the first portion (201) to a lower edge of the second portion (202). The charging assembly (4) is disposed
(Continued)

between the first and second portions (201,202) and includes a circuit board, a chip (401) disposed on the circuit board and contacted with the first portion (201), a charging coil and an exciting unit. The connecting assembly (5) defines a first end electrically connected with the circuit board. A method for charging an apparatus with the wireless charging device (100) is also provided.

20 Claims, 2 Drawing Sheets

(51) Int. Cl.
    *H02J 7/02* (2016.01)
    *H01L 23/40* (2006.01)
    *H01L 23/427* (2006.01)

(52) U.S. Cl.
    CPC .......... *H02J 7/0052* (2013.01); *H02J 7/025* (2013.01); *H01L 23/427* (2013.01); *H01L 2924/0002* (2013.01)

(56) References Cited

U.S. PATENT DOCUMENTS

| | | | |
|---|---|---|---|
| 2007/0146990 A1 | 6/2007 | Hsieh | |
| 2008/0007914 A1 | 1/2008 | Peng et al. | |
| 2009/0033880 A1 | 2/2009 | Heo et al. | |
| 2009/0052139 A1* | 2/2009 | Lai | H01L 23/467 361/707 |
| 2009/0261778 A1* | 10/2009 | Kook | H02J 7/0044 320/108 |
| 2011/0050164 A1* | 3/2011 | Partovi | H01F 5/003 320/108 |
| 2011/0084657 A1* | 4/2011 | Toya | H02J 7/0044 320/108 |
| 2012/0139355 A1* | 6/2012 | Ganem | H02J 5/005 307/104 |
| 2012/0235501 A1* | 9/2012 | Kesler | H03H 7/40 307/104 |
| 2012/0242159 A1* | 9/2012 | Lou | H03H 7/40 307/104 |
| 2014/0062392 A1* | 3/2014 | Lofy | H05K 7/20845 320/108 |
| 2014/0139179 A1* | 5/2014 | Chen | H02J 7/025 320/108 |
| 2015/0276189 A1* | 10/2015 | Palfreyman | F21V 21/14 362/235 |

FOREIGN PATENT DOCUMENTS

| | | |
|---|---|---|
| CN | 202696681 U | 1/2013 |
| CN | 203278291 U | 11/2013 |
| EP | 1 732 230 A2 | 12/2006 |
| EP | 1 885 170 A1 | 2/2008 |

OTHER PUBLICATIONS

Written Opinion for International Application No. PCT/CN2014/075427 dated Aug. 5, 2014.
International Search Report for corresponding International Application No. PCT/CN2014/075427, dated Aug. 5, 2014.

* cited by examiner

WIRELESS CHARGING DEVICE AND METHOD USING THE SAME

CROSS-REFERENCE TO RELATED APPLICATIONS

The present application is a U.S. National Stage of International Application No. PCT/CN2014/075427, filed Apr. 15, 2014, which claims the benefit of Chinese Patent Application No. 201310128803.0, titled "WIRELESS CHARGING DEVICE AND METHOD USING THE SAME," filed Apr. 15, 2013; and Chinese Patent Application No. 201320186562.0, titled "WIRELESS CHARGING DEVICE AND METHOD USING THE SAME," filed Apr. 15, 2013, of which the entire content of both are hereby incorporated by reference.

FIELD

Embodiments of the present disclosure generally relate to a field of wireless charging, more particularly to a wireless charging device and a method for charging an apparatus with the wireless charging device.

BACKGROUND

Nowadays, everyone has many electronic products. Different electronic products need different charging devices and charging cables. The electronic product needs to be connected to the charging cable when being charged, which is inconvenient to the consumers. There are also some wireless charging devices in the market now. When charging the electronic product by the wireless charging device, there is no need to use a charging cable. The working principle of the wireless charging device is based on radio waves and electromagnetic induction technology. Firstly a current is generated in the wireless charging device by the induction between the coil of the wireless charging device and the coil of an exterior charging device, and then the current is converted into electromagnetic wave signals which is transmitted from the wireless charging device to an apparatus to be charged and converted into a direct current via a receiving unit in the apparatus. In this way, the apparatus may be charged successfully.

For example, CN202696681U discloses a wireless charging cover for mobile phone, and the wireless charging cover is used as the back cover of the mobile phone, thus organizing the back cover and the mobile phone as a whole, then the mobile phone is charged. However, conventional wireless charging devices have very poor heat dissipation functions. Therefore heat generated during the charging process could not be released and could accumulate within the apparatus. In this condition, not only the charging efficiency is reduced, but also cause some safety risks to the consumers.

SUMMARY

Embodiments of the present disclosure seek to solve at least one of the problems existing in the prior art to at least some extent.

According to embodiments of a first aspect of the present disclosure, a wireless charging device is provided. The wireless charging device may include: a shell; a heat conduction plate including a first portion, a second portion parallel with the first portion and contacted with an inner surface of the shell, and a third portion connecting a lower edge of the first portion to a lower edge of the second portion; a charging assembly disposed between the first and the second portions and including a circuit board, a chip disposed on the circuit board and contacted with the first portion, a charging coil and an exciting unit; and a connecting assembly defining a first end electrically connected with the circuit board.

In some embodiments, the heat conduction plate may have a U shape.

In some embodiments, the first to third portions may be integrally formed.

In some embodiments, the shell may be adapted to contact with an apparatus to be charged, and the connecting assembly may define a second end adapted to connect with the apparatus to be charged.

In some embodiments, the first and second portions may be of the same shape.

In some embodiments, the heat conduction plate further may include a notch formed at a lower edge thereof and adapted to receive the connecting assembly.

In some embodiments, the first portion and the chip may be adapted to each other in shape.

In some embodiments, the connecting assembly may include a connector fixed with the circuit board, and an elastic pin defining a first end electrically connected to the circuit board and a second end connected the apparatus to be charged.

In some embodiments, the shell may include a snapping element formed on the inner surface thereof and adapted to connect with the apparatus to be charged via a snap fit.

In some embodiments, the shell may include a plurality of snapping elements distributed uniformly on a peripheral of the inner surface of the shell.

In some embodiments, the heat conduction plate may be made of copper.

In some embodiments, the wireless charging device may further include a ceramic thermal barrier disposed between the second portion and the circuit board.

In some embodiments, the ceramic thermal barrier and the circuit board may be adapted to each other in shape.

In some embodiments, the wireless charging device may further include a first heat-conducting glue layer provided between the ceramic thermal barrier and the second portion.

In some embodiments, the wireless charging device may further include a second heat-conducting glue layer provided between the chip and the first portion.

In some embodiments, the wireless charging device may further include a third heat-conducting glue layer provided between the shell and the second portion.

In some embodiments, each of the first to third heat-conducting glue layers may include a heat-conductive silicone grease.

In some embodiments, the wireless charging device may further include a glue shield cover provided on a side surface, away from the shell, of the charging assembly.

In some embodiments, the wireless charging device may further include a protective layer provided on a surface of the glue shield cover.

According to the embodiments of the present disclosure, the heat conduction plate is provided within the wireless charging device, thus the heat generated on the chip of the charging assembly may be effectively transmitted to the shell of the wireless charging device to be released to the environment. In this way, heat accumulation within the wireless charging device may be reduced or even avoided. The wireless charging device may have a high charging efficiency and improved safety performances.

In another aspect of embodiments of the present disclosure, a method for charging an apparatus with a wireless charging device is provided. The method may include the steps of: providing the wireless charging device as described above; and disposing the apparatus within the shell and electrically connecting a charging terminal of the apparatus to the connecting assembly.

In some embodiments, the apparatus may be a mobile phone.

According to the embodiments of the present disclosure, the heat conduction plate is provided within the wireless charging device, thus the heat generated on the chip of the charging assembly may be effectively transmitted to the shell of the wireless charging device to be released to the environment. In this way, heat accumulation within the wireless charging device may be reduced or even avoided. The method may provide a high charging efficiency and improved safety performances.

Additional aspects and advantages of embodiments of present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of embodiments of the present disclosure will become apparent and more readily appreciated from the following descriptions made with reference to the accompanying drawings, in which.

DETAILED DESCRIPTION

Figure 1:
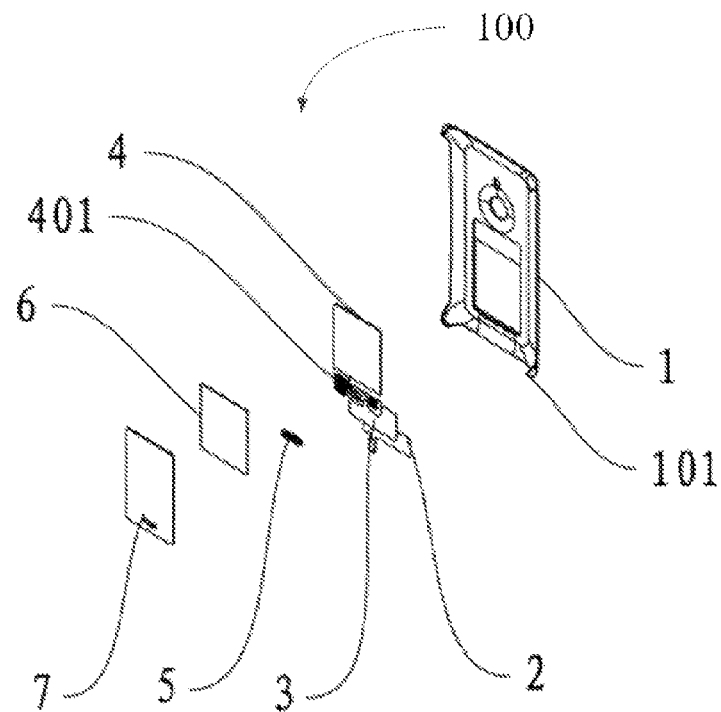
FIG. 1 is an exploded perspective view of a wireless charging device according to an embodiment of the present disclosure.

Reference will be made in detail to embodiments of the present disclosure. The same or similar elements and the elements having same or similar functions are denoted by like reference numerals throughout the descriptions. The embodiments described herein with reference to drawings are explanatory, illustrative, and used to generally understand the present disclosure. The embodiments shall not be construed to limit the present disclosure.

In addition, terms such as "first" and "second" are used herein for purposes of description and are not intended to indicate or imply relative importance or significance. Thus, features limited by "first" and "second" are intended to indicate or imply including one or more than one these features. In the description of the present disclosure, "a plurality of" relates to two or more than two.

In the description of the present disclosure, unless specified or limited otherwise, it should be noted that, terms "mounted," "connected," "coupled" and "fastened" may be understood broadly, such as permanent connection or detachable connection, electronic connection or mechanical connection, direct connection or indirect connection via intermediary, inner communication or interaction between two elements. Those having ordinary skills in the art should understand the specific meanings in the present disclosure according to specific situations.

In the description of the present disclosure, a structure in which a first feature is "on" a second feature may include an embodiment in which the first feature directly contacts the second feature, and may also include an embodiment in which an additional feature is formed between the first feature and the second feature so that the first feature does not directly contact the second feature, unless otherwise specified. Furthermore, a first feature "on," "above," or "on top of" a second feature may include an embodiment in which the first feature is right "on," "above," or "on top of" the second feature, and may also include an embodiment in which the first feature is not right "on," "above," or "on top of" the second feature, or just means that the first feature has a sea level elevation larger than the sea level elevation of the second feature. While first feature "beneath," "below," or "on bottom of" a second feature may include an embodiment in which the first feature is right "beneath," "below," or "on bottom of" the second feature, and may also include an embodiment in which the first feature is not right "beneath," "below," or "on bottom of" the second feature, or just means that the first feature has a sea level elevation smaller than the sea level elevation of the second feature.

It's appreciated that, in the embodiments of the present disclosure, the inner side of the shell may refer to the side of the shell which is facing the apparatus to be charged.

Some illustrative and non-limiting examples are provided hereunder for a better understanding of the present invention and for its practical embodiment.

According to embodiments of a first aspect of the present disclosure, a wireless charging device 100 may include: a shell 1, a heat conduction plate 2, a charging assembly 4 and a connecting assembly 5. In some embodiments, the heat conduction plate 2 may include a first portion 201, a second portion 202 parallel with the first portion 201 and contacted with an inner surface of the shell 1, and a third portion 203 connecting a lower edge of the first portion 201 to a lower edge of the second portion 202. In some embodiments, the charging assembly 4 may be disposed between the first and the second portions 201, 202 and includes a circuit board, a chip 401 disposed on the circuit board, a charging coil and an exciting unit, in which the chip 401 is contacted with the first portion 201. In some embodiments, the connecting assembly 5 may define a first end electrically connected with the circuit board.

The wireless charging device 100 will be described hereinafter with reference to FIGS. 1 to 4.

In the progress of wirelessly charging an electronic device, such as a mobile phone, the charging efficiency may not reach 100% because a part of energy may be lost in the form of heat. Moreover, the heat may be stored in some parts of the apparatus to be charged, for example, CPU, memory, battery, etc., which may be accumulated between the apparatus and the shell of the wireless charging device 100 and hard to release. In the embodiments of the present disclosure, the heat conduction plate 2 is provided in the wireless charging device 100, therefore the heat dissipation performance of the wireless charging device 100 may be greatly improved.

In some embodiments, the heat conduction plate 2 may have a U shape. In some embodiments, the heat conduction plate 2 may have a U-shaped cross-section.

In some embodiments, the first, second and third portions 201, 202, 203 of the connecting plate 2 may be integrally formed. In an embodiment, the third portion 203 connects bottoms of the first and second portions 201, 202, so as to form a U-shaped cross-section of the heat conduction plate 2.

In some embodiments, the connecting assembly 5 may define a second end adapted to connect with the apparatus to be charged.

There are no special limits to the structure of the charging assembly 4 and the connecting assembly 5 in the present disclosure. For example, the charging assembly 4 may include a circuit board, a charging coil and an excitation sheet assembly, in which the chip may be disposed on the circuit board. There are no special limits to the assembling location of the circuit board, the charging coil and the excitation sheet assembly. As known to those skilled in the art, the chip 401 is disposed on a surface of the circuit board which is facing the apparatus to be charged, therefore facilitating to charge the apparatus. Said surface is away from the shell 1, thus the heat accumulated on the chip 401 may not be dissipated via the shell 1 directly, which may be accumulated within the wireless charging device 100 with heats on other parts.

Figure 2:
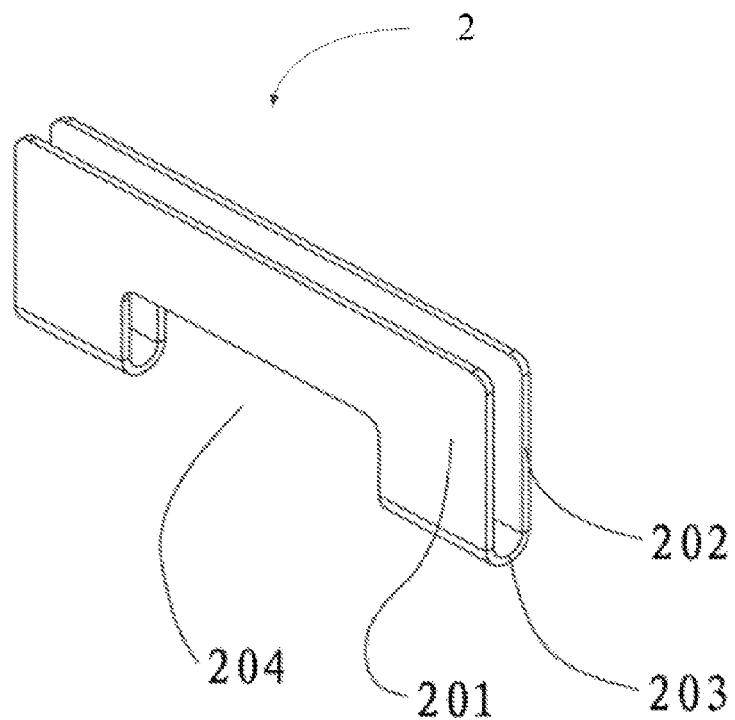
FIG. 2 is a schematic diagram of a heat conduction plate of a wireless charging device according to an embodiment of the present disclosure.
Figure 3:
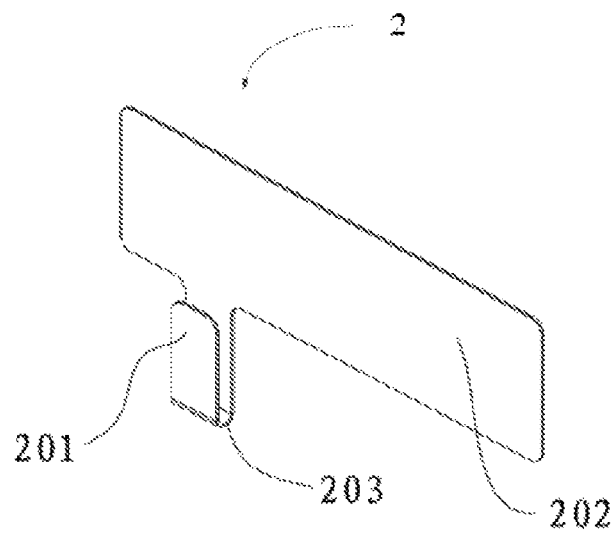
FIG. 3 is a schematic diagram of a heat conduction plate of a wireless charging device according to another embodiment of the present disclosure.

In some embodiments, the first portion 201 of the heat conduction plate 2 and the chip 401 may be adapted to each other in shape, as shown in FIGS. 2 and 3. There are no special limits for the shape of the second portion 202 of the heat conduction plate in the present disclosure. By way of example and without limits, the second portion 202 and the circuit board may be adapted to each other in shape, or the second portion 202 and a predetermined heat-dissipating area on the shell 1 may be adapted to each other in shape.

In some embodiments of the present disclosure, the connecting assembly 5 may include a connector and an elastic pin. The connector may be fixed with the circuit board of the charging assembly. The elastic pin may define a first end electrically connected to the circuit board of the charging assembly and a second end connected with the apparatus to be charged.

In some embodiments, the charging assembly 4 may be disposed between the first portion 201 and the second portion 202. The first portion 201 may contact to the chip 401 of the charging assembly 4, and the second portion 202 may contact to the inner surface of the shell 1. Thus, the heat generated on the chip 401 may be transmitted to the first portion 201. Since the first portion 201, the second portion 202 and the third portion 203 are integrated with each other, the heat may be transmitted from the first portion 201 to the second portion 202, and then to the inner surface of the shell 1 which is contacted to the second portion 202, and finally the heat may be released out of the wireless charging device 100 via the air circulation between the heat and the air outside the shell 1.

There are no special limits to the manufacturing method of the heat conduction plate 2. In some embodiments of the present disclosure, the heat conduction plate 2 may be formed by an integral impact molding step and a cutting step.

The inventors have found that, metals such as copper has a good thermal conductivity and a high strength, which may facilitate the heat dissipating of the wireless charging device 100 and may be used as the material for making the heat conduction plate 2. In some embodiments, the heat conduction plate 2 may be made of copper, without special limits in the present disclosure.

In some embodiments, the first and second portions 201, 202 may be of the same shape, as shown in FIG. 2. Thus the charging assembly 4 may be hold between the first and second portions 201, 202 of the heat conduction plate 2. In some embodiments, the heat conduction plate 2 may further include a notch 204. The notch 204 may be formed at a lower edge of the heat conduction plate 2 and adapted to receive the connecting assembly 5. Then the elastic pin of the connecting assembly 5 may be electronically connected with the circuit board of the charging assembly 4, and the elastic pin of the connecting assembly 5 may be electronically connected to the apparatus to be charged.

In some embodiments, the area of the first portion 201 may be smaller than that of the second portion 202, and the heat conduction plate 2 may further include a groove formed between the first and second portions 201, 202, as shown in FIG. 3. The groove may be formed in a lower edge of the heat conduction plate 2 and adapted to receive the connecting assembly 5. The first portion 201 may be contacted with the chip 401 and used for transmitting the heat generated on the chip 401. There are no special limits for the surface area of the first portion 201, provided the heat may be transmitted efficiently. In some embodiments, the first portion 201 may have rather small surface area. Then the manufacturing cost may be reduced and processing method may be simple.

Figure 4:
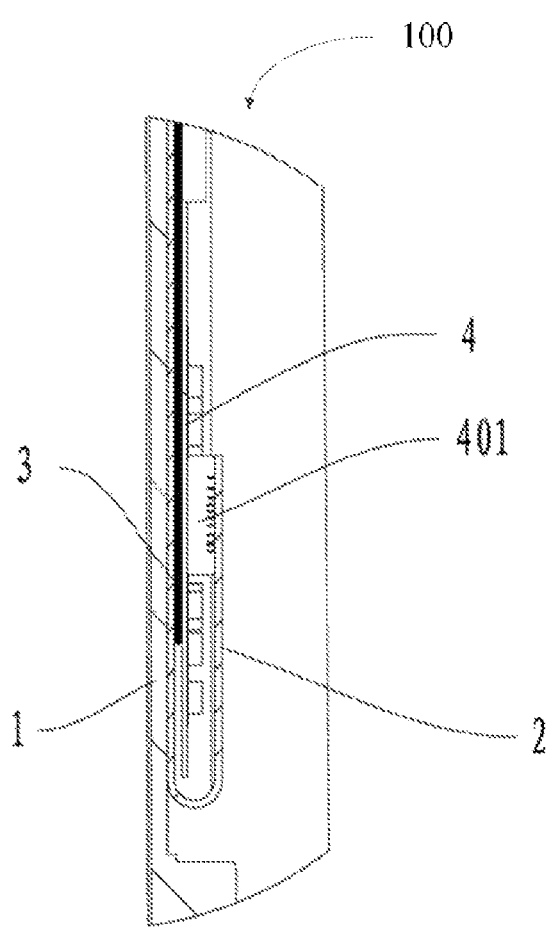
FIG. 4 is a cross-sectional view of a wireless charging device according to an embodiment of the present disclosure.

In some embodiments of the present disclosure, the shell 1 is adapted to contact to the apparatus to be charged. In some embodiments, the shell 1 may include a snapping element 101 formed on the inner surface thereof and adapted to connect with the apparatus to be charged via a snap fit. In some embodiments, the shell 1 may include a plurality of snapping elements 101 distributed uniformly on a peripheral of the inner surface of the shell 1. As shown in FIGS. 1 and 4, in some embodiments, the shell 1 may include four snapping elements 101 distributed uniformly at the four corners of the lower surface of the shell 1. When the wireless charging device 100 according to embodiments of the present disclosure is used for charging an apparatus, the apparatus to be charged may be fixed in the shell 1 via a snap-joint between the snapping element 101 and the apparatus. Then the assembling and removing of the apparatus to be charged may be convenient.

In one embodiment of the present disclosure, the wireless charging device 100 may further include a ceramic thermal barrier 3 disposed between the second portion 202 of the heat conduction plate 2 and the circuit board of the charging assembly 4. In some embodiments, the ceramic thermal barrier 3 and the circuit board may be adapted to each other in shape. Therefore, the heat transmitting from the second portion 202 back to the circuit board 3 may be well prevented. Thus it may be ensured that the heat transmitting in the wireless charging device 100 may be carried out in a one-way direction, i.e., chip 401 first portion 201 of heat conduction plate 2→third portion 203 of heat conduction plate 2→second portion 202 of heat conduction plate 2→shell 1→air outside the shell 1.

In some embodiments of the present disclosure, the wireless charging device 100 may further include a first heat-conducting glue layer provided between the ceramic thermal barrier 3 and the second portion 202. Then the contact between the ceramic thermal barrier 3 and the second portion 202 may be improved.

In some embodiments, the wireless charging device 100 may further include a second heat-conducting glue layer provided between the chip 401 and the first portion 201 of the heat conduction plate 2. Then the contact between the first portion 201 and the chip 401 may be improved.

In some embodiments, the wireless charging device 100 may further include a third heat-conducting glue layer provided between the shell 1 and the second portion 202. Then the contact between the shell 1 and the second portion 202 may be improved.

According to embodiments of the present disclosure, the first, second and third heat-conducting glue layers may not only improve the contact/adhesion between two adjacent parts, but also increase the area for transmitting heat.

There are no limits to the first, second and third heat-conducting glue layers, any conventional heat-conducting glue may be used to make the first, second and third heat-conducting glue layers. In some embodiments, each of the first, second and third heat-conducting glue layers may include a heat-conductive silicone grease. The inventors have found that, by preparing the heat-conducting glue layer with the heat-conducting silicone grease, the contact/adhesion between two adjacent parts and the heat-conducting performances may be enhanced.

As shown in FIG. 1, in some embodiments, the wireless charging device 100 may further include a glue shield cover 6 provided on a side surface, away from the shell 1, of the charging assembly 4. Thus the magnetic field from the interior of the apparatus to be charged may be shielded. The circuit board, the charging coil and the excitation unit are all facing the apparatus to be charged for the convenience to charging, which may cause inevitable magnetic field inside the apparatus. With the glue shield cover 6, it may prevent the magnetic field inside the apparatus from influencing the charging assembly 4.

As shown in FIG. 1, in some embodiments, the wireless charging device 100 may further include a protective layer 7 provided on a surface of the glue shield cover 6. Thus the parts inside the wireless charging device 100 may be protected. Further, it may provide the wireless charging device 100 with a good appearance. There are no special limits for the protective layer 7 in the present disclosure. By way of example and without limits, the protective layer 7 may be formed by a soft paper or a non-metallic layer.

The wireless charging device 100 according to embodiments of the present disclosure may be a receiving terminal for wireless charging, which may be matched with any transmitting terminal for wireless charging, e.g., any conventional public facility for wireless charging and used for charging any electrical apparatus. By way of example and without limits, the apparatus to be charged may be any conventional electrical apparatus, such as a mobile phone or MP3.

According to the embodiments of the present disclosure, the heat conduction plate is provided within the wireless charging device, thus the heat generated on the chip of the charging assembly may be effectively transmitted to the shell of the wireless charging device to be released to the environment. In this way, heat accumulation within the wireless charging device may be reduced or even avoided. The wireless charging device may have a high charging efficiency and improved safety performances.

In another aspect of embodiments of the present disclosure, a method for charging an apparatus with a wireless charging device is provided. The method may include the steps of: providing the wireless charging device as described above; and disposing the apparatus within the shell and electrically connecting a charging terminal of the apparatus to the connecting assembly.

In some embodiments, the method may be performed by using the wireless charging device as shown in FIG. 1 or 4. The method may be performed with the following steps.

First, the apparatus to be charged is assembled in the wireless charging device. In an embodiment, this step may be performed by disposing the apparatus in the shell 1 of the wireless charging device and forming a snap-joint by connecting the snapping element 101 of the shell 1 and a snapping element of the apparatus to be charged.

Then a charging terminal of the apparatus to be charged and the connecting assembly 5 of the wireless charging device may be electrically connected. In an embodiment, this step may be performed by electronically connecting the charging terminal of the apparatus and the elastic pin of the connecting assembly 5.

And then the apparatus received within the wireless charging device is placed within a chargeable space of the public charging platform for wireless charging, i.e. the chargeable space may be consisted with the electro-magnetic inducting space for a rechargeable battery in the apparatus.

In some embodiments, the apparatus may be a mobile phone.

In some embodiments, the apparatus may be an MP3.

According to the embodiments of the present disclosure, the heat conduction plate is provided within the wireless charging device, thus the heat generated on the chip of the charging assembly may be effectively transmitted to the shell of the wireless charging device to be released to the environment. In this way, heat accumulation within the wireless charging device may be reduced or even avoided. The method may provide a high charging efficiency and improved safety performances.

Reference throughout this specification to "an embodiment", "some embodiments", "an example", "a specific example" or "some examples," may indicate that a particular feature, structure, material, or characteristic described in connection with the embodiment or example is included in at least one embodiment or example of the present disclosure. The appearances of the phrases throughout this specification are not necessarily referring to the same embodiment or example of the present disclosure. Furthermore, the particular features, structures, materials, or characteristics may be combined in any suitable manner in one or more embodiments or examples.

Although explanatory embodiments have been shown and described, it would be appreciated by those skilled in the art that the above embodiments cannot be construed to limit the present disclosure, and changes, alternatives, and modifications can be made in the embodiments without departing from spirit, principles and scope of the present disclosure.

What is claimed is:

1. A wireless charging device comprising:
   a shell;
   a heat conduction plate comprising a first portion, a second portion parallel with the first portion and contacted with an inner surface of the shell, and a third portion connecting a lower edge of the first portion to a lower edge of the second portion;
   a charging assembly disposed between the first and second portions and comprising a circuit board, a chip disposed on the circuit board and contacted with the first portion, a charging coil and an exciting unit; and
   a connecting assembly defining a first end electrically connected with the circuit board.

2. The wireless charging device according to claim 1, wherein the heat conduction plate has a U shape.

3. The wireless charging device according to claim 1, wherein the first second and third portions are integrally formed respectively.

4. The wireless charging device according to claim 1, wherein the shell is adapted to contact with an apparatus to be charged, and the connecting assembly further defines a second end adapted to connect with the apparatus to be charged.

5. The wireless charging device according to claim 1, wherein the first and second portion are of the same shape.

6. The wireless charging device according to claim 1, wherein the heat conduction plate further comprises a notch formed at a lower edge thereof and adapted to connect the connecting assembly with the charging assembly.

7. The wireless charging device according to claim 1, wherein the first portion and the chip are adapted to each other in shape.

8. The wireless charging device according to claim 4, wherein the connecting assembly comprises:
a connector fixed with the circuit board, and
an elastic pin defining a first end electrically connected to the circuit board and a second end connected to the apparatus to be charged.

9. The wireless charging device according to claim 4, wherein the shell further comprises a snapping element formed on the inner surface thereof and adapted to connect with the apparatus to be charged via a snap fit.

10. The wireless charging device according to claim 1, wherein the shell further comprises a plurality of snapping elements distributed uniformly on a peripheral of the inner surface of the shell.

11. The wireless charging device according to claim 1, wherein the heat conduction plate is made of copper.

12. The wireless charging device according to claim 1, further comprising a ceramic thermal barrier disposed between the second portion and the circuit board.

13. The wireless charging device according to claim 12, wherein the ceramic thermal barrier and the circuit board are adapted to each other in shape.

14. The wireless charging device according to claim 1, further comprising a second heat-conducting glue layer provided between the chip and the first portion.

15. The wireless charging device according to claim 1, further comprising a third heat-conducting glue layer provided between the shell and the second portion.

16. The wireless charging device according to claim 14, wherein the second heat-conducting glue layer comprises a heat-conductive silicone grease.

17. The wireless charging device according to claim 16, further comprising a glue shield cover provided on a side surface, away from the shell, of the charging assembly.

18. The wireless charging device according to claim 17, further comprising a protective layer provided on a surface of the glue shield cover.

19. A method for charging an apparatus with a wireless charging device, comprising:
providing a wireless charging device, wherein wireless charging device comprising:
a shell;
a heat conduction plate comprising a first portion, a second portion parallel with the first portion and contacted with an inner surface of the shell, and a third portion connecting a lower edge of the first portion to a lower edge of the second portion;
a charging assembly disposed between the first and second portions and comprising a circuit board, a chip disposed on the circuit board and contacted with the first portion, a charging coil and an exciting unit; and
a connecting assembly defining a first end electrically connected with the circuit board; and
disposing the apparatus within the shell and electrically connecting a charging terminal of the apparatus to the connecting assembly.

20. The method according to claim 19, wherein the apparatus is a mobile phone.

* * * * *